(12) United States Patent
Reuber

(10) Patent No.: US 11,217,407 B2
(45) Date of Patent: Jan. 4, 2022

(54) METHOD FOR OPERATING A MEDIUM VOLTAGE CIRCUIT BREAKER OR RECLOSER AND MEDIUM VOLTAGE CIRCUIT BREAKER OR RECLOSER ITSELF

(71) Applicant: ABB Schweiz AG, Baden (CH)

(72) Inventor: Christian Reuber, Willich (DE)

(73) Assignee: ABB SCHWEIZ AG, Baden (CH)

(*) Notice: Subject to any disclaimer, the term of this patent is extended or adjusted under 35 U.S.C. 154(b) by 28 days.

(21) Appl. No.: 16/827,729

(22) Filed: Mar. 24, 2020

(65) Prior Publication Data

US 2020/0227221 A1    Jul. 16, 2020

Related U.S. Application Data

(63) Continuation of application No. PCT/EP2018/075664, filed on Sep. 21, 2018.

(30) Foreign Application Priority Data

Sep. 26, 2017 (EP) .................................... 17193120

(51) Int. Cl.
| | |
|---|---|
| *H01H 11/00* | (2006.01) |
| *H01H 47/00* | (2006.01) |
| *H01H 47/22* | (2006.01) |
| *H01H 47/32* | (2006.01) |
| *H01H 9/56* | (2006.01) |
| *G01R 31/327* | (2006.01) |
| *H01H 33/59* | (2006.01) |

(52) U.S. Cl.
CPC ...... *H01H 33/593* (2013.01); *H01H 11/0062* (2013.01); *H01H 2011/0068* (2013.01)

(58) Field of Classification Search
CPC .......... H01H 33/593; H01H 2047/008; H01H 11/0062; H01H 2011/0068; H01H 9/56; H01H 2009/566; H01H 1/0015; G01R 31/3274

See application file for complete search history.

(56) References Cited

U.S. PATENT DOCUMENTS

| | | | | |
|---|---|---|---|---|
| 9,406,451 | B2* | 8/2016 | Schrag | H01H 1/0015 |
| 9,425,012 | B2* | 8/2016 | Takeuchi | H01H 33/6662 |
| 9,514,576 | B2* | 12/2016 | Gerundt | G07C 5/006 |
| 9,650,980 | B2* | 5/2017 | Wirkowski | F02D 41/2441 |
| 10,224,165 | B2* | 3/2019 | Tanigaki | H01H 1/0015 |
| 10,228,076 | B2* | 3/2019 | Domhan | F16K 31/0675 |
| 10,395,868 | B2* | 8/2019 | Bianco | G01R 31/3274 |
| 10,510,473 | B2* | 12/2019 | Yoshida | H01F 7/18 |

(Continued)

FOREIGN PATENT DOCUMENTS

CN          100580474 C    1/2010

*Primary Examiner* — Sisay G Tiku

(74) *Attorney, Agent, or Firm* — Leydig, Voit & Mayer, Ltd.

(57) ABSTRACT

A method for operating a medium voltage circuit breaker or recloser comprising at least one electric pole, each including a movable contact and a fixed contact, being in a closed or an open position after switching operations of the medium voltage circuit breaker or recloser, and an electromagnetic actuator, includes: monitoring a travel curve of the movable contact, the travel curve being derived by an evaluation of a shape of an applied current and a shape of an applied voltage using a mathematical representation of the electromagnetic actuator.

5 Claims, 1 Drawing Sheet

(56) References Cited

U.S. PATENT DOCUMENTS

| | | | |
|---|---|---|---|
| 10,593,493 B2* | 3/2020 | Takasuka | H01F 7/1844 |
| 10,777,992 B2* | 9/2020 | Blumschein | H02H 3/05 |
| 2007/0222427 A1* | 9/2007 | Takeuchi | G01R 31/3333 |
| | | | 324/71.2 |
| 2008/0157776 A1 | 7/2008 | Jaffer et al. | |
| 2012/0053886 A1 | 3/2012 | Poeltl | |
| 2014/0069784 A1 | 3/2014 | Cazals | |

\* cited by examiner

METHOD FOR OPERATING A MEDIUM VOLTAGE CIRCUIT BREAKER OR RECLOSER AND MEDIUM VOLTAGE CIRCUIT BREAKER OR RECLOSER ITSELF

CROSS-REFERENCE TO PRIOR APPLICATION

This application is a continuation of International Patent Application No. PCT/EP2018/075664, filed on Sep. 21, 2018, which claims priority to European Patent Application No. EP 17193120.7, filed on Sep. 26, 2017. The entire disclosure of both applications is hereby incorporated by reference herein.

FIELD

The invention relates to a medium voltage circuit breaker or recloser equipped with an electromagnetic drive and with means for monitoring the travel curves of the closing and opening operation.

BACKGROUND

Monitoring is becoming a trend in medium voltage switchgear applications. One important aspect here are the travel curves of the switching device for the detection of any deviations of the stroke and/or the speed of the switching operations, both for the closing and for the opening operation.

The travel curve is the change of the position of the contacts or the drive over time during the switching operation from OFF to ON or vice versa. Travel curves are typical for a certain switching device. A travel curve that was recorded e.g. during the routine testing of a switching device can be used as a reference, and the travel curves that are recorded during the operations in field can be compared with this reference. While matching travel curves confirms the good condition of the switching device, deviating travel curves can be used to recommend predictive maintenance.

Normally, for this kind of diagnostics, it is required to add one or several physical sensors to the circuit breaker or recloser, to be able to record the travel curves.

SUMMARY

In an embodiment, the present invention provides a method for operating a medium voltage circuit breaker or recloser comprising at least one electric pole, each comprising a movable contact and a fixed contact, configured to be in a closed or an open position after switching operations of the medium voltage circuit breaker or recloser, and an electromagnetic actuator, the method comprising: monitoring a travel curve of the movable contact, the travel curve being derived by an evaluation of a shape of an applied current and a shape of an applied voltage using a mathematical representation of the electromagnetic actuator.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention avoids the need of additional physical sensors at the drivechain of the CB or recloser, and to determine its travel curves with high accuracy from the measurements of voltage and current, which will be anyhow available with an electromagnetic drive.

In an embodiment, the present invention provides a travel curve is derived by the evaluation of the shape of the applied current and the shape of the applied voltage, using a mathematical representation of the electromagnetic drive or actuator.

In an advantageous embodiment of a first alternative, the actuator is driven that means steered with a controlled current, in such, that a current controller and a voltage source with pulse width modulation (PWM) is used.

In a further advantageous embodiment, in a first phase of the operation, an almost constant voltage in a first phase is applied in such, that the current is increasing to its desired value, and after that, in a second phase, the current is kept constant, and the voltage is reduced to cover mainly the resistive losses of current in the actuator, and in a third phase, when the motion of the actuator takes place, the voltage is increased to compensate for the back electromagentic force and to keep the current constant, and when the end position is reached at the end of the third phase, the voltage is reduced again in a fourth phase and again covers mainly the resistive losses of the current in the coil as in the second phase.

In a further advantageous embodiment, the position of the actuator is obtained from the current and the voltage values by determination of the speed or velocity of the actuator movement and then by numerical integration of the speed.

The actuator can have a permanent magnetic circuit that can magnetically latch both the closed and the open position of the drive. For this permanent latch, no current in the coil is required.

Positive current in the coil is required for bringing the actuator from the open to the closed position. With negative current the closed position can be unlatched, and the actuator is driven by opening spring forces from the closed to the open position.

In a second alternative of the method, the actuator is driven with a constant voltage, e.g. by connecting it to a charged capacitor or a battery.

Figure 1:
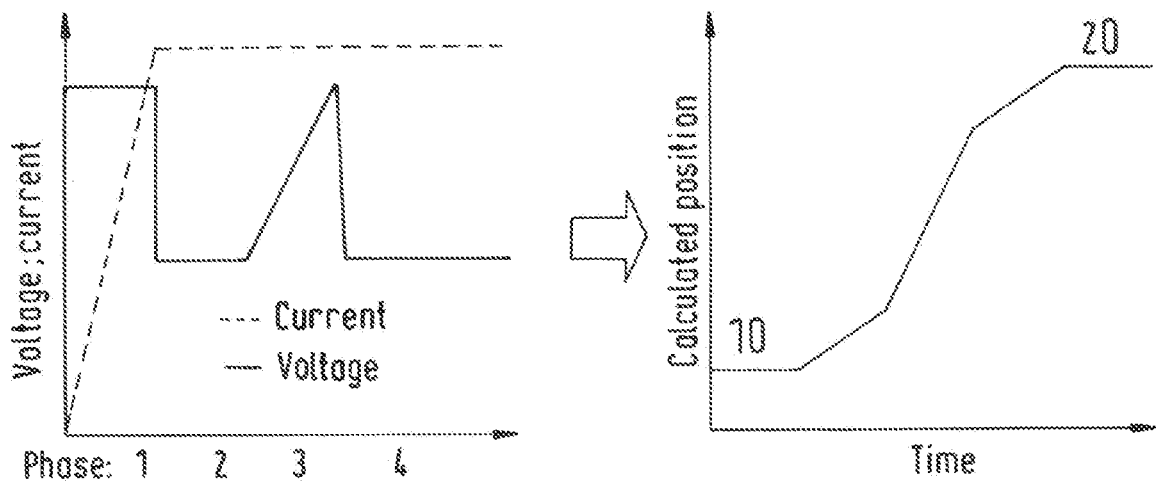
FIG. 1 shows the characteristic current and voltage when driving the actuator with a controlled current, e.g. using a current controller and a voltage source with pulse width modulation PWM.
Figure 2:
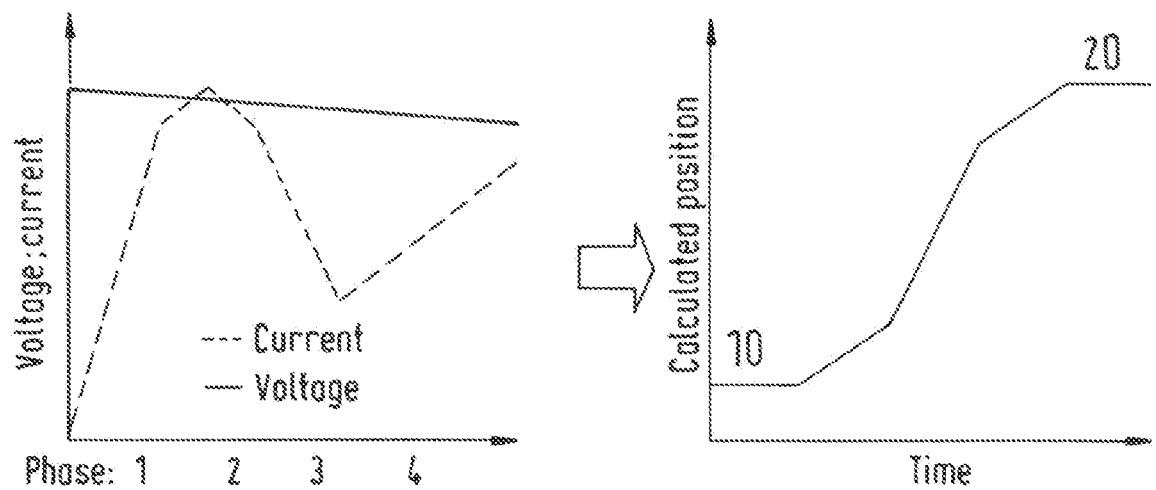
FIG. 2 shows the typical voltage and current when driving the actuator with a constant voltage, e.g. by connecting is to a charged capacitor or a battery.

The invention is further shown in FIGS. 1 and 2.

One method is to drive the actuator with a controlled current, e.g. using a current controller and a voltage source with pulse width modulation PWM. The characteristic current and voltage of that kind of operation is shown in FIG. 1. In the first phase, an almost constant voltage is applied so that the current is increasing to its desired value.

When this level of current is reached, the current is kept constant (phase 2). Therefore, the voltage is reduced and covers mainly the resistive losses of the current in the coil.

When the motion of the actuator is taking place in the third phase, the voltage has to be increased to compensate for the back e.m.f. and to keep the current constant. Back e.m.f. is a voltage that is generated by the motion of the actuator due to the change of flux in the actuator's coil. The effect of the back e.m.f. is always directed against the current, i.e. without control, the current would be reduced. A descriptive physical explanation is that electromagnetic energy ($\frac{1}{2}LI^2$) is transformed to mechanical energy ($\frac{1}{2}mv^2$), and as v increases, I is reduced when the energy is transformed due to the conversation of energy.

However, in the considered case, the current controller would notice this tendency of current reduction and it would compensate the reduction of current by increasing the voltage.

The magnitude of the back e.m.f. is related to the speed of the motion, and therefore the speed can be derived from the back e.m.f. and so from the voltage needed to keep the current constant.

The flux linked with the actuator's coil depends both on the current and the position of the movable plunger of the actuator, and both relationships are usually quite nonlinear. Therefore, a detailed model of the actuator where this information is included is required to perform a calculation of the speed from the current and the voltage of the actuator.

Knowing the speed, the position can be obtained by numerical integration.

When the end position is reached at the end of phase 3, the voltage is reduced at the begin of phase 4 and again covers mainly the resistive losses of the current in the coil as in phase 2.

The right part of FIG. 1 indicates that the evaluation of current and voltage results in a travel curve, starting at a first position 10, e.g. OFF, and ending at a second position 20, e.g. ON.

Another method is to drive the actuator with a constant voltage, e.g. by connecting is to a charged capacitor or a battery. The typical voltage and current of that kind of operation is shown in FIG. 2.

In the first phase, the almost constant voltage is applied, so that the current is increasing as usual in an inductor. The actual shape is determined by the inductance and the resistance of the inductor.

In the second phase, a maximum current is reached and the current starts to be reduced due to the back e.m.f.

In the third phase, this effect is continued at higher speed and clearly visible. Also here, it can be seen that electromagnetic energy ($\frac{1}{2}LI^2$) is transformed to mechanical energy ($\frac{1}{2}mv^2$): as v increases, I is reduced when the energy is transformed due to the conversation of energy.

At the end of this phase, the end position of the actuator is reached, speed and back e.m.f. due to the speed become zero.

In phase 4, the current is increasing as long as the applied voltage is supporting this increase.

The right part of FIG. 2 indicates that the evaluation of current and voltage results in a travel curve, starting at a first position 10, e.g. OFF, and ending at a second position 20, e.g. ON.

The voltage U across an inductor is generally expressed as:

$$U = R*I + \frac{d\Psi}{dt}$$

where R is the ohmic resistance of the circuit, I is the current, $\Psi$ is the flux that is linked with the coil, and $d\Psi/dt$ is the induced voltage due to the change of the flux linkage with the time.

As the flux linkage depends both on the current I and on the position x of the plunger of the actuator in the magnetic circuit, these effects can be separated:

$$U = R*I + \frac{\partial \Psi}{\partial I} * \frac{dI}{dt} + \frac{\partial \Psi}{\partial x} * \frac{dx}{dt}$$

The needed quantity is the speed—this is dx/dt. The equation can then be written as:

$$\frac{dx}{dt} = \frac{U - R*I - \frac{\partial \Psi}{\partial I} * \frac{dI}{dt}}{\frac{\partial \Psi}{\partial x}}$$

The quantities U and I are known from measurements. The resistance of the coil R is considered to be constant; in case of need the temperature of the coil can be measured or calculated to adjust R accordingly.

dI/dt can be derived from the measured I.

$\partial\Psi/\partial I$ and $\partial\Psi/\partial x$ can be calculated in advance—using e.g. 2D or 3D finite element method FEM—for discrete values of I and x, covering the range of all possible I and all possible x and being stored in look-up tables. For the calculation of the speed, either the closest values in the tables can be used or the values can be interpolated.

These equations can be solved for discrete time steps, and so the change of the current, the voltage, the flux and the position can be determined for each single time step.

Finally, the speed can be integrated over the time steps to obtain the travel curve.

For increasing the accuracy of the procedure, it is additionally proposed to fix the speed to zero when the derived actuator position is at one of the known limit positions; i.e. to avoid integration results below the mechanical minimum and above of the mechanical maximum of the stroke.

For further increasing the accuracy of the procedure, it is additionally proposed to consider the influence of eddy currents in the model. Due to the change of flux in all conductive parts of the magnetic circuit, eddy currents are induced in these parts. These currents are opposing the coil current; practically they are reducing the effective coil current. The influence of eddy currents can be calculated e.g. in a transient finite element method (FEM) computation for a reference operation with nominal speed, but also for modified operations with increased or decreased speed. Then these results can also be summarised in look-up tables so that they can be considered for the recognition of the travel curve.

This principle can also be applied to magnetic actuators with two separate coils where one coil is used for closing the drive, and the other coil is used for opening the drive.

The purpose of the recognised travel curve is mainly the detection of a deviation of the actual curve compared to the original curve, that is e.g. recorded during routine testing or commissioning of the switching device. Reasons for this kind of deviations may be a variation in speed due to increased or decreased friction or external forces that have changed, e.g. broken springs. Further, a limited stroke of the drive can be recognized, e.g. due to worn bearings or due to small particles that are blocking the operation, completely or partially.

The user of the drive can then get a warning message with the purpose to inspect the device.

In case the drive is blocked e.g. by a small particle it can happen that the closed position is not fully reached, a small airgap can remain between the fixed and the movable part of the drive. It can happen that this position is hold as long as the current is flowing in the coil. When the current is switched off, it can happen that the remaining latching force—from the permanent magnets alone—is not sufficient to keep the system in the closed position. The drive will open. This can be recognized by the system when the current controller is still active and tries to control the current to zero. The back e.m.f. is then visible in the effective voltage of the controller, as described above.

In case the actuator is driven with constant voltage, the opening will result in a current e.g. in the freewheeling circuit. Also this can be monitored and evaluated.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for operating a medium voltage circuit breaker or recloser comprising at least one electric pole, each comprising a movable contact and a fixed contact, configured to be in a closed or an open position after switching operations of the medium voltage circuit breaker or recloser, and an electromagnetic actuator comprising a coil, the method comprising:

monitoring a travel curve of the movable contact, the travel curve being derived by an evaluation of a shape of an applied current and a shape of an applied voltage using a mathematical representation of the electromagnetic actuator; and wherein in a first phase of the operation, an almost constant voltage in the first phase is applied such that the current increases to a desired value, and after that, in a second phase, the current is kept constant and the voltage is reduced to cover resistive losses of current in the actuator, and in a third phase, when a motion of the actuator takes place, the voltage is increased to compensate for a back electromagnetic force and to keep the current constant, and when an end position of the actuator is reached at an end of the third phase, the voltage is reduced again in a fourth phase and covers the resistive losses of the current in the coil.

2. The method according to claim 1, wherein the actuator is driven so as to be steered with a controlled current such that a controller and a voltage source with pulse width modulation (PWM) is used.

3. The method according to claim 1, wherein the actuator is driven with a constant voltage.

4. The method according to claim 3, wherein the actuator is driven with the constant voltage by connecting the actuator to a charged capacitor or a battery.

5. The method according to claim 1, wherein a position of the actuator and of the medium voltage circuit breaker or recloser is obtained from the current and the voltage values by determination of a speed or velocity of an actuator movement and then by numerical integration of the speed.

* * * * *